(12) United States Patent
Paltiel et al.

(10) Patent No.: US 10,290,754 B2
(45) Date of Patent: May 14, 2019

(54) LIGHT HARVESTING ANTENNA COMPLEXES

(71) Applicant: YISSUM RESEARCH DEVELOPMENT COMPANY OF THE HEBREW UNIVERSITY OF JERUSALEM LTD, Jerusalem (IL)

(72) Inventors: Yossef Paltiel, Maskeret Batya (IL); Shira Yochelis, Ness Ziona (IL); Nir Keren, Modi'in (IL); Ido Eisenberg, Jerusalem (IL)

(73) Assignee: Yissum Research Development Company of the Hebrew University of Jerusalem Ltd., Jerusalem (IL)

( * ) Notice: Subject to any disclaimer, the term of this patent is extended or adjusted under 35 U.S.C. 154(b) by 4 days.

(21) Appl. No.: 14/442,513

(22) PCT Filed: Nov. 14, 2013

(86) PCT No.: PCT/IL2013/050942
§ 371 (c)(1),
(2) Date: May 13, 2015

(87) PCT Pub. No.: WO2014/076701
PCT Pub. Date: May 22, 2014

(65) Prior Publication Data
US 2016/0087128 A1    Mar. 24, 2016

(51) Int. Cl.
*H01L 31/0352* (2006.01)
*H01L 31/0216* (2014.01)
(Continued)

(52) U.S. Cl.
CPC ........... *H01L 31/035236* (2013.01); *H01L 31/02167* (2013.01); *H01L 31/055* (2013.01); *B82Y 20/00* (2013.01); *Y02E 10/52* (2013.01); *Y10S 977/774* (2013.01); *Y10S 977/827* (2013.01); *Y10S 977/948* (2013.01)

(58) Field of Classification Search
CPC ............................................. H01L 31/035236
See application file for complete search history.

(56) References Cited

U.S. PATENT DOCUMENTS

| | | | |
|---|---|---|---|
| 2007/0181906 A1* | 8/2007 | Chik | B82Y 20/00 257/103 |
| 2007/0209696 A1* | 9/2007 | Duerr | H01G 9/2031 136/252 |

(Continued)

FOREIGN PATENT DOCUMENTS

DE    102007043215 A1    3/2009

OTHER PUBLICATIONS

Deshpandea et al., "Optical properties of silicon nitride films deposited by hot filament chemical vapor deposition", J. Appl. Phys. 77 (12), Jun. 15, 1995, pp. 6534-6541.*

(Continued)

*Primary Examiner* — Tae-Sik Kang
(74) *Attorney, Agent, or Firm* — Vorys, Sater, Seymour and Pease LLP

(57) ABSTRACT

The invention disclosed concerns a simple ring-hub arrangement of interacting two-level systems using a theoretical quantum jump approach which mimics a biological light-harvesting antenna connected to a reaction center.

15 Claims, 5 Drawing Sheets

(51) Int. Cl.
*H01L 31/055* (2014.01)
*B82Y 20/00* (2011.01)

(56) References Cited

U.S. PATENT DOCUMENTS

| | | |
|---|---|---|
| 2009/0090410 A1 | 4/2009 | Labelle |
| 2010/0313940 A1 | 12/2010 | Wehrspohn et al. |
| 2011/0192446 A1 | 8/2011 | Kawai et al. |
| 2012/0060918 A1 | 3/2012 | Spitzer |
| 2012/0222723 A1 | 9/2012 | Mayer et al. |

OTHER PUBLICATIONS

"Photovoltaic Cells, Solar Power, and LEDs", Burn an energy journal, [online], [published on Jul. 7, 2012, retrieved on Oct. 22, 2014]. Retrieved from the Internet<URL: http://burnanenergyjournal.com/photovoltaic-cells-solar-power-and-leds-2/>, pp. 1-3.*

Apr. 1, 2014 International Search Report issued in International Patent Application No. PCT/IL2013/050942.

Collini et al; "Coherent intrachain energy migration in a conjugated polymer at room temperature;" Science; vol. 323; Jan. 16, 2009; p. 369.

Gotesman et al; "Self-assembly of nanoparticle arrays on semiconductor substrate for charge transfer cascade;" Journal of Physical Chemistry A American Chemical Society; Jul. 2, 2009; vol. 113. No. 26; pp. 7213-7217.

Green, M.A.; "Third generation photovoltaics;" Springer-Verlag, 2003; pp. 35-55.

Green et al.; "Solar cell efficiency tables (version 36);" Progress in Photovoltaics: Research and Applications; Jun. 18, 2010; pp. 346-352.

Lee et al; "Coherence dynamics in photosynthesis: protein protection of excitonic coherence;" Science; Jun. 8, 2007; vol. 316; pp. 1462.

Neubauer et al.; "Local cathode luminescence resonant peak in hybrid organic nanocrystal systems;" The Journal of Physical Chemistry; 2012; vol. 116; pp. 15641.

van Grondelle et al; "Energy transfer in photosynthesis: experimental insights and quantitative models;" Physical Chemistry Chemical Physics; 2006. vol. 8; pp. 793.

* cited by examiner

LIGHT HARVESTING ANTENNA COMPLEXES

TECHNOLOGICAL FIELD

This invention generally relates to light harvesting antenna complexes and uses thereof in, e.g., construction of photovoltaic cells.

BACKGROUND OF THE INVENTION

The world's energy consumption, even with improved conservation measures, is projected to triple, reaching approximately 46 trillion watts (TW) by the end of this century. With regard to future energy needs, it is noteworthy that $1.2 \times 10^5$ TW is deposited on the surface of the earth by the sun, in a broad IR to UV spectrum. The central energy challenge revolves around conversion, storage and efficient use of this immense solar power source.

Silicon-based solar cells supply the most reliable, cheapest and most common solution for high efficiency solar cells. It is therefore expected that solar cell farms will use some form of Si (amorphous, polycrystalline, or nanostructure) either as the active energy harvesting element, or as a substrate. Nevertheless, existing Si technology generating electric power is still about 3 times more expensive than energy from fossil fuels. A substantial improvement in Si-based solar cell efficiency is therefore essential.

The fundamental limits of solar energy conversion efficiency were explored by Shockley and Queisser for a p-n junction [1]. For an idealized p-n 1.3 eV bandgap junction, 30% maximum theoretical efficiency is predicted. Realistically, the p-n junction solar cell is limited by losses from a variety of sources including carrier thermalization and recombination, contact and junction losses and transparency losses. To date, the highest efficiency photovoltaic devices have been fabricated using multiple p-n junctions, the so-called tandem solar cells. The tandem cell efficiency record has recently exceeded 40% [2]. However, the requirements of lattice parameter and current matching between cells limit the development and increase the cost of the single cell.

Finding a simple way to couple organic layer to existing Si solar cells for increasing the cells' efficiency is of major importance. In this case, even an initial small improvement in cell efficiency of up to 3% would be useful. This improvement is an example of one possible application the system can achieve if quantum principles are exploited.

As the existing semiconductor technology shrinks in size beyond its current 45 nm, and as 22 nm fabrication technology is being developed, quantum nano-structures are likely to become the primary components of future electronic devices. Future revolution will create many opportunities for new engineering features. The fabrication of quantum devices is riddled with a number of major challenges and breakthroughs are required before a new generation of quantum electronics and logic operating devices are successfully produced. These challenges include device fabrication difficulties, which typically require micro- to nanometer scale resolution, de-coherence which erodes the operation of a quantum device, in addition to the resolution of crucial problems of control, such as manipulation and measurement of the quantum states in a device. Using a hybrid approach that applies quantum mechanical properties commensurate with simple classical measurement, may be the essential step towards using room-temperature quantum mechanics in real devices.

In several cases, nature uses quantum mechanics to achieve extraordinary results. A well-known example is the high photon conversion efficiency of photosynthetic light harvesting complexes, using coherence properties and quantum processes in the short scale. Recent experimental advances in various multi-chromophoric assemblies have raised the fascinating possibility that quantum coherent dynamics plays a role in photosynthetic energy transfer, even at room temperature [3-5]. Electron dynamics of bi-layered assembly [6] or a tri-layered assembly [7] of chromphors with different or equivalent energy gap structures, respectively, on a substrate have been discussed. These remarkable findings indicate that a key to the survival of quantum coherence in this temperature regime is the emergence of correlated energetic fluctuations between different chromophores, which are closely spaced, thus enabling the pigments to share the same coherent modes.

REFERENCES

[1] M. A. Green, Third Generation Photovoltaics, Springer-Verlag, New York, 35-55 (2003).
[2] M. A. Green, K Emery, Y Hishikawa, W Warta—Progress in Photovoltaics Research and Applications 346-352 (2010).
[3] H. Lee, Y. C. Cheng, G. R. Fleming, Science 316, 1462 (2007).
[4] E. Collini and G. D. Scholes, Science 323, 369 (2009).
[5] R. van Grondelle, and V. I. Novoderezhkin, Energy transfer in photosynthesis: experimental insights and quantitative models. Physical Chemistry Chemical Physics 8 793 (2006).
[6] G. Gotesman, D. H. Waldeck, and R. Naaman, J. Phys. Chem. A 113, 7213 (2009).
[7] A. Neubauer, S. Yochelis, I. Popov, A. Ben Hur, K. Gradkowski, U. Banin, and Y. Paltiel, J. Phys. Chem. C 116, 15641 (2012).

SUMMARY OF THE INVENTION

The inventors of the invention disclosed herein have developed a simple ring-hub arrangement of interacting two-level systems using a theoretical quantum jump approach which mimics a biological light-harvesting antenna connected to a reaction center. In the presence of quantum coherent energy transfer, together with energetic disorder, the efficiency of excitation transfer from the antenna to the reaction center depends intimately on the quantum superposition properties of the initial state. In most theoretical depictions of a full complex, the excitons travel between the capturing antennas to the reaction center in a step-like quantum cascade of states yielding a very efficient, noise-robust charge transfer.

There are drawbacks to directly using biological light-harvesting antenna complexes. First, biological materials are built to expire in order to successfully fulfill their dynamic roles in the life cycle of an organism; and, second, the isolation of intact functional proteins, on a large scale, is an expensive task that requires scientific skill-sets and facilities.

The inventors of the present invention have developed a nano toolbox bottom-up approach, which may be combined with a top-down designed electric/opto-electric element, in order to improve (increase efficiency) electronic/optoelectronic characteristics of, e.g., existing Si solar cells. The invention is based on a component mimicking nature and having a cascade of energy states, the component being comprised of (self)assembled multi-chromophoric nanoparticles interconnected by organic molecules, the component being in turn conjugated to another component which collects (and/or transmits) the charge carriers by either up-conversion or down-conversion processes. Thus, the present invention is aimed at providing an efficient controlled pathway of charge and energy transfer in electronic/opto-electronic components.

In accordance with the present invention, molecular self-assembly of material moieties (e.g., nanoparticles) into a structured multilayer assembly is implemented to control the pathway of charge and energy transfer by tuning the band-gap structure of each assembled material layer. This combination of nanoparticles, having various tunable properties, together with control over binding molecules, which are used to construct the multilayered structure, creates the novel means permitting easy, efficient and cost-effective self-assembly of all components into a supramolecular system having pre-designed optical and electronic properties.

Thus, in one aspect the invention provides an element comprising a substrate and a multilayered structure, said multilayered structure comprising at least two nanoparticle layers, said multilayered structure being associated with at least a region of said substrate's surface, each of said nanoparticle layers comprising nanoparticles of a different type;

wherein the band gap of the substrate material being larger than the band gap of nanoparticles in a layer directly associated with the substrate, and wherein the band gap of the substrate material being smaller than the band gap of nanoparticles in the top most layer of said multilayered structure. This way, wavelength longer than that absorbed by the substrate is absorbed by the substrate-associated nanoparticles layer and shorter wavelength is being absorbed by the nanoparticles at the top-most layer.

The "multilayered structure" formed on at least a region of the substrate comprises two or more layers of nanoparticles, which are positioned (stacked, assembled) one on top of the other such that the first layer is sandwiched between a substrate surface and a second layer, the second layer being sandwiched between the first and third layers and each subsequent layer is positioned between a previous and subsequent layers.

In some embodiments, the two or more layers are stacked co-axially.

In some embodiments, the multilayered structure comprises (a) a substrate-associated first layer, herein referred to "first nanoparticles layer" or "first layer", (b) a layer which is positioned furthest away from the substrate surface and which is associated to only one layer, herein referred to as the "top-most layer", and (c) at least one additional layer of nanoparticles, being positioned between the layer associated with the substrate, and the top-most layer, wherein the band gap of the nanoparticles of said at least one additional layer (c) being smaller than the band gap of the nanoparticles in the top-most layer (b) and larger than the band gap of the nanoparticle in the first layer (a).

In some embodiments, the multilayered structure comprises (a) a substrate-associated first layer, (b) a layer which is positioned furthest away from the substrate surface and which is associated to only one layer, and (c) at least one additional layer of nanoparticles, being positioned between the layer associated with the substrate and the top-most layer, wherein the band gap of the nanoparticles of said at least one additional layer (c) being smaller than the band gap of the nanoparticles in the top-most layer (b) and larger than the band gap of the nanoparticle in the first layer (a), and wherein the band gap of the nanoparticles of the (or each) at least one additional layer is smaller than the band gap of a subsequent additional layer of nanoparticles, wherein the subsequent additional layer of nanoparticles is further away from the substrate.

In some embodiments, the multilayer structure of nanoparticles forms a gradual energy band gap (an energy funnel), wherein the layer of nanoparticles with the smallest band gap is the layer of nanoparticles directly associated to the substrate (first nanoparticle layer).

In some embodiments, the multilayer structure of the nanoparticles forms a gradual conduction band structure (or LUMO), wherein the layer of nanoparticles with the lowest conduction band (energy state) is the layer of nanoparticles associated to the substrate (first nanoparticle layer).

In some embodiments, the multilayer structure of the nanoparticles forms a gradual valence band (or the HOMO) structure, wherein the layer of nanoparticles with the highest valence band (energy state) is the layer of nanoparticles associated to the substrate (first nanoparticle layer).

It should be understood that in cases where the surface of the substrate comprises a distribution of more than one surface region, each of said surface regions may be associated with a multilayered structure, as defined herein, wherein the first layer, as well as any subsequent layers of each of said multilayered structure may or may not be of the same nanoparticle type, as defined herein. Also, each surface region may be associated with a multilayered structure comprising a different number of layers.

In some embodiments, the overall number of layers in the multilayer is less than 50. In some embodiments, the overall number of layers in the multilayer is less than 30. In some embodiments, the overall number of layers in the multilayer is less than 20. In some embodiments, the overall number of layers in the multilayer is more than 2. In some embodiments, the overall number of layers in the multilayer is more than 3. In some embodiments, the overall number of layers in the multilayer is more than 4. In some embodiments, the overall number of layers in the multilayer is more than 5. In some embodiments, the overall number of layers in the multilayer is more than 6. In some embodiments, the overall number of layers in the multilayer is more than 7. In some embodiments, the overall number of layers in the multilayer is more than 8. In some embodiments, the overall number of layers in the multilayer is more than 9. In some embodiments, the overall number of layers in the multilayer is more than 10. In other embodiments, the overall number of layers is between 2 to 10. In further embodiments, the number of layers is 2 or 3 or 4 or 5 or 6 or 7 or 8 or 9 or 10 layers. In still further embodiments, the number of layers is 2 or 3 or 4 or 5 layers.

As stated above, nanoparticles layer(s) are formed (deposited, assembled) on at least a region of the substrate's surface. The association of the nanoparticles with the surface region is typically via linker molecules, e.g., organic molecules. The nanoparticles of any of the layers in the multilayer are inter-layer associated via organic linker molecules, which may or may not be the same as the linker molecules associating the first layer to the surface. Similarly, each layer may be associated with neighboring layers via same or different linker moieties or in the absence of those.

The nanoparticles of the first layer may be associated to the surface region via linkers which may be pre-assembled on the substrate or via nanoparticles capping molecules or in the absence of those.

Each of the layers in the multilayer comprises nanoparticles of a different type, such that the band-gap characteristics are tuned to afford the band-gap structure defined hereinabove. The nanoparticles of one layer may differ from nanoparticles of another layer (namely they may be of different nanoparticle types) in at least one of nanoparticle material, nanoparticle size, nanoparticle shape (e.g., elongated nanoparticles, etc), nanoparticle structure (e.g., multipod, core-shell, etc), presence or absence of doping atoms (materials), selection of dopants, concentration of dopants, valance band offset and particle band structure.

In some embodiments, at least two layers in the multilayer structure differ in more than one parameter (e.g., size and shape).

In some embodiments, at least three layers in the multilayer structure differ in more than one parameter.

In some embodiments, at least four layers or at least five layers in the multilayer structure differ in more than one parameter.

In other embodiments, at least two layers in the multilayer structure differ in 2 or 3 or 4 or 5 or 6 or 7 or 8 parameters.

In other embodiments, at least three layers in the multilayer structure differ in 2 or 3 or 4 or 5 or 6 or 7 or 8 parameters.

In other embodiments, at least four layers or at least five layers in the multilayer structure differ in 2 or 3 or 4 or 5 or 6 or 7 or 8 parameters.

In some embodiments, each of the layers in the multilayer differs from one another in one or more parameter (e.g., all layers are of the same material shape, structure etc., but differ from one another in their size). In some embodiments, each two layers differ in a different parameter(s) (one or more parameter) than each two other layers in the multistructure (e.g., two layers differ in the size of the nanoparticles; other two layers differ in the presence or absence of doping). In some embodiments, some of the layers differ from each other in one or more parameter(s), and some of the layers differ from each other in another one or more parameter(s).

In some embodiments, the different types of nanoparticles in the multilayer are layers of nanoparticles of different size. In some embodiments, the different types of nanoparticles in the multilayer are layers of nanoparticles of different materials. In some embodiments, the different types of nanoparticles in the multilayer are layers of nanoparticles of different shapes. In some embodiments, the different types of nanoparticles in the multilayer are layers of nanoparticles of different structures. In some embodiments, the different types of nanoparticles in the multilayer are layers of nanoparticles having different doping atoms or absence of doping atoms. In some embodiments, the different types of nanoparticles in the multilayer are layers of nanoparticles of different selection of dopants. In some embodiments, the different types of nanoparticles in the multilayer are layers of nanoparticles of different concentration of dopants. In some embodiments, the different types of nanoparticles in the multilayer are layers of nanoparticles of different valence band offsets. In some embodiments, the different types of nanoparticles in the multilayer are layers of nanoparticles of different band structures.

In some embodiments, the different types of nanoparticles in the multilayer are layers of nanoparticles of shapes and/or sizes. In some embodiments, the different types of nanoparticles in the multilayer are layers of nanoparticles of different shapes and/or different sizes and/or materials. In some embodiments, the different types of nanoparticles in the multilayer are layers of nanoparticles of different structures and/or sizes and/or materials. In some embodiments, the different types of nanoparticles in the multilayer, are layers of nanoparticles of different sizes and/or different materials and/or which differ in the presence or absence of doping atoms (materials). In some embodiments, the different types of nanoparticles in the multilayer are layers of nanoparticles of different sizes and/or different materials and/or which differ in the selection of dopants. In some embodiments, the different types of nanoparticles in the multilayer are layers of nanoparticles of different sizes and/or different materials and/or which differ in the concentration of dopants. In some embodiments, the different types of nanoparticles in the multilayer are layers of nanoparticles of different sizes and/or different materials and/or structures and/or which differ in the selection of dopants. In some embodiments, the different type of nanoparticles in the multilayer is layers of nanoparticles of different size and/or different material and/or different valence offset. In some embodiments, the different types of nanoparticles in the multilayer are layers of nanoparticles of different sizes and/or different material and/or different particle band structures.

The "nanoparticle material" refers to the chemical composition of the nanoparticle. The nanoparticle material may or may not be doped. Generally speaking, the nanoparticles are composed of a material selected from a semiconductor material, a metal and an insulator.

In some embodiments, the nanoparticles are composed of a material selected from a semiconductor and/or a metal.

In some embodiments, the nanoparticles are selected amongst metallic nanoparticles. Non-limiting examples include Sc, Ti, V, Cr, Mn, Fe, Ni, Cu, Zn, Y, Zr, Nb, Tc, Ru, Mo, Rh, W, Au, Pt, Pd, Ag, Mn, Co, Cd, Hf, Ta, Re, Os, Ir, Hg, Rf, Db, Sg, Bh, Hs and Mt.

In some embodiments, the nanoparticles are composed of a rare-earth material.

In some embodiments, the nanoparticles are of a material from Group IIIB, IVB, VB, VIB, VIIB, VIIIB, IB, IIB, IIIA, IVA or VA of block d of the Periodic Table of the Elements, or are comprised of (or contain) such a material.

In some embodiments, the nanoparticles are or comprise a transition metal selected from Groups IIIB, IVB, VB, VIB, VIIB, VIIIB, IB and IIB of block d of the Periodic Table. In some embodiments, the transition metal is a metal selected from Sc, Ti, V, Cr, Mn, Fe, Ni, Cu, Zn, Y, Zr, Nb, Tc, Ru, Mo, Rh, W, Au, Pt, Pd, Ag, Mn, Co, Cd, Hf, Ta, Re, Os, Ir, Hg, Rf, Db, Sg, Bh, Hs, and Mt.

In some embodiments, the nanoparticles are semiconductor nanoparticles selected from elements of Group II-VI, Group III-V, Group IV-VI, Group III-VI, Group IV semiconductors and combinations thereof.

In other embodiments, the nanoparticles are semiconductor nanoparticles selected from Group II-VI materials, being selected from CdSe, CdS, CdTe, ZnSe, ZnS, ZnTe, HgS, HgSe, HgTe, CdZnSe and any combination thereof.

In some embodiments, the nanoparticles comprise CdSe and/or CdS and/or CdTe.

In further embodiments, Group III-V materials are selected from InAs, InP, InN, GaN, InSb, InAsP, InGaAs, GaAs, GaP, GaSb, AlP, AlN, AlAs, AlSb, CdSeTe, ZnCdSe and any combination thereof.

In additional embodiments, the nanoparticles are semiconductor nanoparticles selected from Group IV-VI, the material being selected from PbSe, PbTe, PbS, PbSnTe, Tl$_2$SnTe$_5$ and any combination thereof.

In other embodiments, the material is or comprises an element of Group IV. In some embodiments, the material is selected from C, Si, Ge, Sn, Pb.

In some embodiments, the material is a metal, a metal alloy, or a metal oxide. Non-limiting examples include ZnO, CdO, $Fe_2O_3$, $Fe_3O_4$, and $In_2O_3$.

In some embodiments, the nanoparticle material comprises ZnO.

In other embodiments, the nanoparticles are selected from $Ag_2S$, $Bi_2S$, $Sb_2S_3$, $Cu_2S$, $CuInS_2$, $CuFeS_2$, $CuGaS_2$, $Cu(InGa)S_2$, $CuAlS_2$, AgS and $Cu_2(ZnSn)S_4$.

In some embodiments, the nanoparticle material comprises InAs.

As stated above, the nanoparticles may be "doped" with at least one dopant atom or ion. The dopant is selected amongst materials which differ from the material (atoms) composing the nanoparticle.

The dopant material may be selected amongst metals and non-metal materials.

In some embodiments, the dopant atom or ions are of Li or Mg or Na or K or Rb or Cs or Be or Ca or Sr or Ba, Sc or Ti or V or Cr or Fe or Ni or Cu or Zn or Y or La or Zr or Nb or Tc or Ru or Mo or Rh or W or Au or Pt or Pd or Ag or Co or Cd or Hf or Ta or Re or Os or Ir or Hg or B or Al or Ga or In or TE or C or Si or Ge or Sn or Pb or P or As or Sb or Bi or O or S or Se or Te or Po or F or Cl or Br or I or At or any combination thereof.

In some embodiments, the dopant is selected from Ag, Au and any combination thereof. In other embodiments, the dopant is Ag. In other embodiments the dopant is Au.

In some embodiments, the nanoparticles are doped with a rare-earth atoms or ions. In some embodiments, the rare-earth atoms or ions are of La or Sc or Y or Lu or Pm or Sm or Ho or Ce or Pr or Gd or Eu or Tb or Dy or Er or Tm or Nd or Yb or any combination thereof.

The doped nanoparticles of the invention may be heavily-doped or lightly-doped.

In some embodiments, the dopant concentration of the nanoparticles being between $1\times10^{13}$ atoms per $cm^3$ to $1\times10^{23}$ atoms per $cm^3$.

In some embodiments, the dopant concentration of the nanoparticles being between $1\times10^{13}$ atoms per $cm^3$ to $1\times10^{18}$ atoms per $cm^3$.

In some embodiments, the dopant concentration of the nanoparticles being between $1\times10^{16}$ atoms per $cm^3$ to $1\times10^{18}$ atoms per $cm^3$.

In some embodiments, the dopant concentration of the nanoparticles being between $1\times10^{18}$ atoms per $cm^3$ to $1\times10^{23}$ atoms per $cm^3$.

In some embodiments, the dopant concentration of the nanoparticles being between $1\times10^{19}$ atoms per $cm^3$ to $1\times10^{22}$ atoms per $cm^3$.

In some embodiments, the dopant concentration of the nanoparticles being between $1\times10^{19}$ atoms per $cm^3$ to $1\times10^{21}$ atoms per $cm^3$.

In some embodiments, the nanoparticle is doped with at least one dopant atom or ion. In some embodiments, the nanoparticle is doped with 1 to 500 dopant atoms or ions. In some embodiments, the nanoparticle is doped with 5 to 200 dopant atoms or ions. In some embodiments, the nanoparticle is doped with 10 to 200 dopant atoms or ions. In some embodiments, the nanoparticle is doped with 10 to 100 dopant atoms or ions. In some embodiments, the nanoparticle is doped with 20 to 50 dopant atoms or ions.

In some embodiments, the nanoparticle is doped with dopant atoms or ions, which constitutes less than 15% of the atoms in the nanoparticle. In some embodiments, the nanoparticle is doped with dopant atoms or ions, which constitutes less than 10% of the atoms in the nanoparticle. In some embodiments, the nanoparticle is doped with dopant atoms or ions, which constitutes between 1% to 15% of the atoms in the nanoparticle.

In some embodiments, the dopants are dispersed within the nanoparticle. In some embodiments, the dopants form islands. In some embodiments, the dopants are situated at (or proximate to) the surface of the nanoparticle.

The nanoparticles forming each of the multilayered structure may be selected based on "nanoparticle size". As known in the art, bulk materials (semiconductors) have a defined band gap, i.e., the energy difference of the edge of the conduction band and the valence band. As a particles size is decreased to a nano-scale regime, the motion of the charge carriers becomes confined. This effect alters the electronic properties of the nanoparticle by splitting the bulk energy bands into discrete states, hence shifting these transitions to higher energies with decreasing nanoparticle size.

The nanoparticles in each layer may be selected by determining the lowest excited state by the following equation when using inter-band transitions:

$$E = E_g + \frac{\hbar^2 \pi^2}{2R^2}\left[\frac{1}{m_h^*} + \frac{1}{m_e^*}\right] - \frac{1.8e^2}{\varepsilon R}$$

where m* is the corresponding effective mass, $$\frac{\hbar^2 k^2}{2m^*},$$

$E_g$ is the band gap of the bulk, and R is the spherical particle radius. In some cases, intra-band transition will be used as well, for example when using doped nano particles and/or core/shell structures.

Typically, the nanoparticles employed in the layers of the invention are discrete particles, at least one of their dimensions being in the nanometric range (1 to 1000 nm), typically 1 nm to 500 nm in length or diameter. In some embodiments, the nanoparticles of the invention are between 1 nm to 100 nm in length and/or diameter. In some embodiments, the nanoparticles of the invention are between 1 nm to 50 nm in length and/or diameter. In other embodiments, the doped nanoparticles are on average in the range of 1 nm to 20 nm in length and/or diameter. In other embodiments, the doped nanoparticles are on average in the range of 3 nm to 20 nm in length and/or diameter. In other embodiments, the doped nanoparticles are on average in the range of 1 nm to 10 nm in length and/or diameter.

The nanoparticles may be of any "nanoparticles shape", typically selected amongst isotropic and anisotropic shaped nanoparticles. The nanoparticles may be selected to display any branched or net structures. Without being limited thereto, the nanoparticles may be symmetrical or unsymmetrical, may be elongated with a rod-like shape, spherical, elliptical, pyramidal, disk-like, branch, network or any irregular shape. In some embodiments, the nanoparticles are selected from quantum dots (QD), nanocrystals, nanospheres, nanorods, nanowires, nanocubes, nanodiscs, branched nanoparticles, and others. Similarly, the "nanoparticles structure" may be selected from layered nanoparticles (i.e., core/shell nanoparticles), single material nanoparticles, nanoparticles with domains of different materials or crystal phase (e.g., multipods such as tetrapods) or segments (barcode), etc.

In some embodiments, the nanoparticles are core-shell structures or core-heteroshell structures. Non-limiting examples of such are CdSe/CdTe, CdSe/ZnS, CdSe/ZnSe CdSe/CdS, InP/CdSe, InP/ZnSe InP/Zn, InAs/CdSe/ZnS, InAs/CdSe/CdS, InAs/InP/ZnSe, InP/ZnSe/ZnS, InP/CdS/ZnSe, InP/CdS/ZnSe, GaAs/CdSe/ZnS, GaAs/CdS/ZnS.

In some embodiments, the nanoparticles are CdSe/CdTe or CdSe/CdS or CdS/CdSe or CdTe/CdSe or CdS/CdTe or CdTe/CdS core shell structure. In some embodiments, the nanoparticles are CdSe/CdS core-shell structure.

In some embodiments, the nanoparticles of certain layers may be different from nanoparticles in each of the subsequent layers in at least one of size and/or material composition. In some embodiments, the nanoparticles of the first layer may be different from nanoparticles in each of the subsequent layers in at least one of size and/or material composition. In some embodiments, the multilayer comprises two nanoparticles layers, wherein the nanoparticles of the first layer are larger in size than the nanoparticles in the second top-most layer. In other embodiments, where the multilayer comprises more than 2 layers, the nanoparticles of the first layer are larger than the nanoparticles in the second layer, which are in turn larger than the nanoparticles in the third layer, and so forth, such that the nanoparticles in the top-most layer are the smallest in size. In such embodiments, the material of the nanoparticles in all layers may or may not be the same.

In some embodiments, each nanoparticles layer comprises nanoparticles of different materials. For example, one layer may comprise metallic nanoparticles and another layer may comprise nanoparticles of one or more semiconductor material. In another example, each layer comprises nanoparticles of semiconductor materials such that the nanoparticles in each layer are different. In another example, each layer comprises doped nanoparticles of semiconductor or metal or metal oxide materials such that the nanoparticles in each layer are different in their level of doping concentration (from null to highly doped).

In accordance with the present invention, each nanoparticles layer is associated with at least one substrate surface region and/or nanoparticles of a preceding and/or subsequent layer. The nanoparticles may be directly associated to the substrate (and/or preceding and/or subsequent layer) or may be associated therewith via linker moieties as disclosed herein. The nanoparticles may be capped with organic molecules which permit linkage of the nanoparticles to the surface or to nanoparticles of another layer (e.g., through functional moieties).

The association of the nanoparticles to the substrate or adjacent nanoparticles layers may be via chemical interaction, such as, covalent, ionic or coordinative bonds or via physical interaction such as Van der Waals forces.

Typically, the multilayered structure is formed by first depositing linker molecules, e.g., organic molecules on at least a region of the substrate's surface. These linker molecules or moieties serve as an adhesive layer which anchors the nanoparticles, at a predetermined distance, to the surface of the substrate or to a preceding or subsequent nanoparticles layer.

In some embodiments, the linker moieties are selected based on their presence or absence of certain functional (linking) groups. In some embodiments, the linker moieties are selected based on their length, i.e., the number of atoms (e.g., carbon) in the linker chain. In other embodiments, the linker moieties are selected to provide controlled pathways of charge or energy transfer (e.g., thereby having an effect on the charge/energy transfer in the element of the invention).

Therefore, the nature of each (organic) linker molecule (e.g., length, delocalized electronic π structure, spectral overlap between emission of one layer of nanoparticles and absorption of an adjacent layer of nanoparticles or the substrate) is pre-determined, so as to permit charge or energy transfer (up-conversion or down-conversion) in the element of the invention (inter-layer between each two layers or a layer and the substrate). This way, the organic molecule layer is actually coupling between the nanoparticles themselves from different layers or within the same layer or between the nanoparticles and the substrate. Thus, even having the same nanoparticles type or size the charge/energy transfer may be controlled by the organic molecule type.

The length of the linker molecules (or the distance between two adjacent layers of nanoparticles or substrate and the first layer of nanoparticles, which may be defined by the ligands on the surface of the nanoparticles or two layers of linkers or any other parameter in the structure) may be in the nanometer or sub-nanometer range. In some embodiments, the length of the linker is between 0.1 to 100 nm. In some embodiments, the length of the linker is between 0.5 to 100 nm. In some embodiments, the length of the linker is between 0.5 to 10 nm. In some embodiments, the length of the linker is between 1 to 10 nm. The linkers are chosen to control the coupling. They can form a tunnel barrier when isolating. The linkers can be conductive or have inherent properties like spin filters when chiral. The linkers may be straight or branched in structure, may contain one or more chiral centers, or may be non-chiral, may contain one or more aromatic or heteroaromatic groups, or one or more heteroatoms.

The linker molecule may be bifunctional, namely having functional groups of a first type, which permit association of the linker with the surface of the substrate, and functional groups of a second type, which permit linker association to a first nanoparticles layer. Linker molecules which are used to associate the substrate to a layer or two consecutive layers may similarly have functional groups of a first type which permit association of the linker to molecules of one layer (e.g., first layer or substrate) and functional groups of a second type which permit association of the linker to a neighboring layer (e.g., second layer).

The first and second functional groups may be the same or different.

In some embodiments, the linker molecules are organic molecules having one or more functional groups selected from a thiol, a carboxylic acid, an amine, a hydroxyl, silane and others. In some embodiments, the linker molecules have di- or multi-functional moieties.

In some embodiments, the linker molecules are organic molecules have a carbon chain with a functional moiety at one or both chain ends. In some embodiments, the carbon chain contains between 1 and 100 carbon atoms. In some embodiments, the carbon chain contains between 1 and 50 carbon atoms. In some embodiments, the carbon chain contains between 1 and 10 carbon atoms. In further embodiments, the carbon chain comprises 1 or 2 or 3 or 4 or 5 or 6 or 6 or 7 or 8 or 9 or 10 carbon atoms.

In some embodiments, the organic molecules are selected from dithiol molecules. Non-limiting examples of dithiol molecules include HS—$(CH_2)_2$—SH (EDT ethanedithiol), HS—$(CH_2)_9$—SH (nonanedithiol), HS—$(CH_2)_{10}$—SH (decanedithiol DT) and HS—$CH_2$-φ-$CH_2$—SH (benzenedimethanethiol BDMT). Non-limiting examples of disilane include $C_4H_6Cl_6Si_2$ (2-methylene-1,3-propanediyl)bis(trichlorosilane), $C_6H_{12}Cl_6Si_2$ (bis(trichlorosilyl)hexane), or a bifunctional molecules with different groups like, but not limited to, $C_6H_{16}O_3SSi$ (mercaptopropyl)trimethoxysilane, $C_2H_7NS$ (2-mercaptoethylamine).

The substrate on which nanoparticles layers are coated is selected to have a defined band structure according to the invention. The substrate may be a flexible or rigid substrate, which may be substantially one-dimensional (a dot) or two-dimensional (a thin flat substrate, or a film) or a three-dimensional curved (non-flat) surface (substrate). Non-limiting examples of substrates may be of a planar shape (rectangular or a disk shape), a round shape, or a ring shape where the multilayered structure is stacked upon it and may or may not cover the substrate surface all around it.

In some embodiments, the substrate is conductive.

In some embodiments, the substrate is transparent. In some embodiments, the substrate is transparent in the visible spectral regime. In some embodiments, the substrate is transparent in the NIR and/or IR spectral regime. In some embodiments, the substrate is transparent in the visible-IR spectral regime. In some embodiments, the substrate is conductive and transparent.

In some embodiments, the substrate is an inorganic semiconductor material, including but not limited to, silicon, tin, compounds of boron, tellurium, geranium, gallium, gallium arsenide (GaAs), gallium phosphide (GaP), cadmium telluride (CdTe), gallium aluminum arsenide (GaAlAs), indium phosphide (InP), gallium arsenide phosphide (GaAsP), cadmium sulfide (CdS), copper indium gallium diselenide (CIGS), mercury cadmium telluride (HgCdTe), and copper indium sulfide or selenide.

In some embodiments, the substrate may be selected from glass, porous glass, quartz, indium tin oxide (ITO), fluorinated tin oxide (FTO) or mica.

In some embodiments, the substrate is a polymer (conductive polymer), such as polyazulenes, polyphenylenes, polypyrenes, polynaphthalenes, poly(pyrrole)s, (PPY), poly(thiophene)s (PT), poly(3,4-ethylenedioxythiophene) (PEDOT), polyazepines, polyindoles, polycarbazoles, poly(p-phenylene vinylene) (PPV), Poly(acetylene)s (PAC), poly(p-phenylene sulfide) (PPS), poly-3-hexyl thiophene (P3HT), polyanilines In some embodiments, the substrate or a region of the substrate is an n-type or p-type semiconductor.

In some embodiments, the substrate is GaAs or Si.

The substrate need not be fully covered with a multilayer of nanoparticles layers. The substrate may have one or more discrete spaced apart surface regions which are associated with a multilayer(s). The spaced apart regions are regions of a material(s) (multilayer(s)) separated by a region(s) of atoms (material) or other multilayer(s) (comprising different type of nanoparticles layers and/or arrangement of the layers of the nanoparticles) or material-free region(s) or different band structure of the substrate (e.g., a substrate comprising a p-type region and an n-type region).

In some embodiments, the multilayer fully (or almost fully) covers the substrate (on at least one substrate faces). In some embodiments, the number of regions in a substrate is at least one. In some embodiments, the number of regions in a substrate is 2 or 3 or 4 or 5 or 6 or 7 or 8 or 9 or 10.

The region's size may be as small as one nanoparticle size. The region's size may be the full size of the substrate (on at least one face of the substrate). In some embodiments, a region's size is defined by the size of the final element function (e.g., the size of the gate in an electronic device element).

In some embodiments, a region size is in a nanometer scale. In some embodiments, a region size is in a sub-micrometer scale. In some embodiments, a region size is in a micrometer scale. In some embodiments, a region size is in a millimeter scale. In some embodiments, a region size is in a centimeter scale.

The substrate or a region(s) of the substrate on which a multi-layer structure(s) is stacked may have variety of band structures.

In some embodiments, the substrate material or a region(s) of the substrate material (being associated with a multilayered structure(s)) is selected to have a band gap smaller than the band gap of the nanoparticles in the first layer.

In some embodiments, the substrate material or a region(s) of the substrate material (being associated with a multilayered structure(s)) is selected to have a band gap larger than the band gap of the nanoparticles in the first layer.

In some embodiments, the substrate material or a region(s) of the substrate material (being associated with a multilayered structure(s)) is selected to have a band gap smaller than the band gap of the nanoparticles in the top-most layer.

In some embodiments, the substrate material or a region(s) of the substrate material (being associated with a multilayered structure(s)) is selected to have a band gap larger than the band gap of the nanoparticles in the first layer and have a band gap smaller than the band gap of the nanoparticles in the top-most layer.

In some embodiments, the substrate material or a region(s) of the substrate material (being associated with a multilayered structure(s)) is selected to have a conduction band (energy state) lower than the conduction band of the nanoparticles in the first layer.

In some embodiments, the substrate material or a region(s) of the substrate material (being associated with a multilayered structure(s)) is selected to have a valence band (energy state) higher than the valence band of the nanoparticles in the first layer.

In some embodiments, the substrate material or a region(s) of the substrate material (being associated with a multilayered structure(s)) is selected to have a conduction band (energy state) higher than the conduction band of the nanoparticles in the first layer.

In some embodiments, the substrate material or a region(s) of the substrate material (being associated with a multilayered structure(s)) is selected to have a valence band (energy state) lower than the valence band of the nanoparticles in the first layer.

In some embodiments, the substrate material or a region(s) of the substrate material (being associated with a multilayered structure(s)) is selected to have a conduction band (energy state) lower than the conduction band of the nanoparticles in the top-most layer.

In some embodiments, the substrate material or a region(s) of the substrate material (being associated with a multilayered structure(s)) is selected to have a valence band (energy state) higher than the valence band of the nanoparticles in the top-most layer.

Thus, in another aspect, the invention provides an element comprising a substrate and at least two spaced-apart multilayer structures, each of said multilayer structure being positioned on a different surface region of said substrate, each of said multilayer structures comprising at least two layers of nanoparticles, wherein the band gap of the surface material being smaller than the band gap of the nanoparticles in a nanoparticle layer associated with a first region of the surface, and wherein the band gap of the surface material being larger than the band gap of the nanoparticles in a nanoparticle layer associated with a further region of the surface.

In some embodiments, at least a surface region of the substrate is associated with a multilayer. The at least surface region is associated with a first layer comprising a plurality of nanoparticles of a first type, said first layer being associated with a second layer comprising nanoparticles of a second type, said second layer being optionally associated with a third layer comprising nanoparticles of a third type, and each subsequent layer comprises a plurality of nanoparticles of at least a further type; the substrate and subsequent nanoparticles layers are selected so as to form an energy band structure, wherein the band gap of the nanoparticles of the first layer being smaller than the band gap of the nanoparticles of the second layer, and the band gap of nanoparticles in each subsequent layer is larger than that of the preceding layer.

In another aspect, the invention provides an element comprising a substrate and at least three layers of nanoparticles, wherein at least a surface region of said substrate being associated with a first layer comprising a plurality of nanoparticles of a first type, said first layer being associated with a second layer comprising nanoparticles of a second type, and sequentially each subsequent layer being composed of nanoparticles of a different type; each nanoparticles type being selected so as to form a gradually increasing band gap structure, wherein the nanoparticles of the first layer are selected to have the smallest band gap and the nanoparticles in the top-most layer are selected to have the largest band gap.

In some embodiments, the substrate material of said element (being associated with a multilayered structure of at least three layers) is selected to have a band gap smaller than the band gap of the nanoparticles in the first layer.

In some embodiments, the substrate material of said element (being associated with a multilayered structure) is selected to have a band gap larger than the band gap of the nanoparticles in the first layer.

In some embodiments, the substrate material of said element (being associated with a multilayered structure) is selected to have a band gap smaller than the band gap of the nanoparticles in the top-most layer.

In some embodiments, the substrate material of said element (being associated with a multilayered structure) is selected to have a band gap smaller than the band gap of the nanoparticles in the first layer.

In some embodiments, the multilayer structure comprises 3, 4, 5, 6, 7, 8, 9, or 10 layers.

The band gap configurations, being up-conversion or down-conversion modalities, permit e.g., construction of more efficient solar cells, as further discussed hereinbelow. The up-conversion or down-conversion phenomena involving the substrate material and the nanoparticles in the multilayered structure associated with the substrate are depicted in Scheme 1a and Scheme 1b, respectfully, and are explained below for the purpose of brevity in connection with a generic solar cell construction. It should be understood that the elements of the invention may be tailored for a great variety of end applications.

Scheme 1a: schematic depiction of an exemplary band structure of an element according to the present invention: a band gap structure scheme of an element involving an up-conversion process.

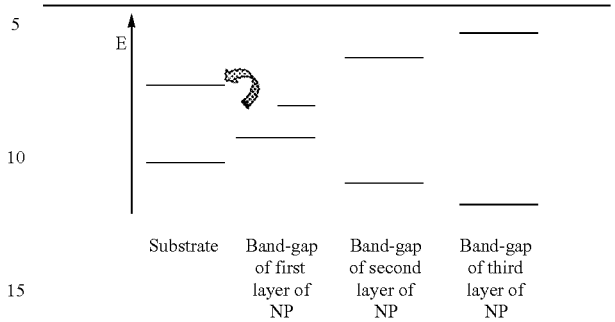

Scheme 1b: schematic depiction of an exemplary band structure of an element according to the present invention: a band gap structure scheme of an element involving a down-conversion process (energy transer process).

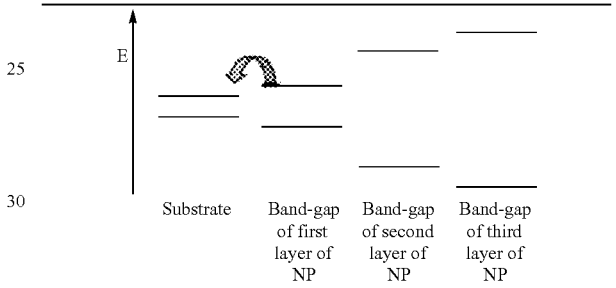

The up-conversion scheme permits modifying the spectrum of photons that are not absorbed by the solar cell to effectively shift the infrared (IR) part of the transmitted spectrum to the NIR or visible part.

As known in the art, photons with energy smaller than the band gap of the solar cell material are not absorbed and their energy is not used for carrier generation. Photons with an energy which is larger than the band gap are absorbed, but the excess energy becomes lost due to thermalization of the generated electrons. These spectral losses in silicon solar cells can be as large as 50%.

As depicted in Scheme 1a above, in the up-conversion scheme, the band gap of the substrate material is larger than the band gap of nanoparticles material in a layer associated with the substrate (the first layer). The band gap of the substrate material is additionally smaller than the band gap of nanoparticles material in the top-most layer (the third layer) of the depicted multilayered structure. More specifically, the band gaps of the substrate and the first nanoparticles layer are tailored (tuned) so that the conduction band gap edge of the component (nanoparticles layer) absorbing the source of photons or charge carriers (light) is lower than the conduction band edge of the substrate. This structure allows photons with energy lower than the band gap of the solar cell to be converted to higher energy photons, which subsequently are directed back to the solar cell and absorbed, thereby increasing its efficiency.

The down-conversion scheme depicted in Scheme 1b, band gap structure is such that the band gap of the substrate material is smaller than the band gap of the nanoparticles in the first layer and any subsequent layer. More specifically, the band gaps of the substrate and the first nanoparticles layer are tailored (tuned) so that the conduction band gap edge of the first nanoparticle layer is higher than the conduction band edge of the substrate, and each subsequent nanoparticles layer is tailored in the same fashion, to give a hierarchy of gradually higher conduction bands from the substrate to the top-most nanoparticles layer. This structure allows absorbed photons to go through a cascade of energy transfer processes, thereby increasing the solar cell efficiency.

Generally, the element of the invention may be tailored to adopt either a type-I or a type-II band configuration. "Type I" refers to the band configuration of a nanostructure, wherein the band offset of nanoparticles of two adjacent layers or a first layer and a substrate is such that the energetic positions of the conduction and valance band edges of one nanoparticles layer are within the conduction and valance band-edges of the other adjacent nanoparticles layer or substrate. "Type II" refers to the staggered band configuration, wherein the energetic position of the conduction band edge of one nanoparticles layer lies between the conduction and valance band edges of the other nanoparticles layer or substrate, and the valance band edge of the one nanoparticles layer lies below that of the other nanoparticles layer or substrate.

The invention described herein may be implemented in different end-applications; each application may require different band structure of the element according to the invention. Thus, the band gap structure of the element may be tuned to specifically tailor such end-applications.

In another aspect the invention provides a method of tuning a bang gap structure of an element according to the invention, the method comprising
  selecting a substrate having a known band gap structure,
  selecting nanoparticles having known band gap structures,
  associating said nanoparticles to a surface of the substrate and to each other to form a multilayered structure on said surface, such that the band structure of the multilayer structure is tuned to the desired structure;
  wherein said nanoparticles are optionally associated to the surface or to each other via linking molecules.

In some embodiments, the band tuning is achieved by selecting different substrate and/or nanoparticles type and/or linker molecules. In some embodiments, the band tuning is achieved by arranging differently the nanoparticles type and/or linker molecules within the element of the invention.

In some embodiments, the element of the invention has a band structure wherein an energy difference between the conduction band edge (and/or valence band edge) of the first nanoparticles layer and the conduction band edge of the second nanoparticles layer and the energy difference of conduction band edge of each two adjacent nanoparticles layers and/or a first layer and a substrate are such that energy and/or charge transfer (e.g., spectral overlap between emission of one layers of nanoparticles and absorption of an adjacent layers of nanoparticles or the substrate) is permitted.

In some embodiments, the element of the invention has a band structure wherein an energy difference between the conduction band edge (and/or valence band edge) of first nanoparticles layer and the conduction band edge of the second nanoparticles layer and an energy difference of conduction band edge of each two adjacent nanoparticles layers and/or a first layer and a substrate are at an equal or a smaller value than the (thermal) energy of the environment (element environment). In some embodiments, the energy difference of conduction band edge (and/or valence band edge) of each two adjacent nanoparticles layers and/or a first layer and a substrate are equal or smaller than 25 meV.

In some embodiments, the band gap of the nanoparticles of the top-most layer is selected to be based on the end-application, e.g., solar cell. In some embodiments, the band gap of the nanoparticles of the top-most layer is equal or smaller than the energy of the (excitation) source (photons). In some embodiments, the band gap of the top-most layer nanoparticles is in the IR spectral regime. In some embodiments, the band gap of the top-most layer nanoparticles is in the NIR spectral regime. In some embodiments, the band gap of the top-most layer nanoparticles is in the visible spectral regime.

In another aspect, the invention provides a method of forming an element according to the invention, the method comprising
  selecting a substrate having a known band gap structure,
  selecting nanoparticles having known band gap structures,
  associating said nanoparticles to a surface of the substrate and to each other to form a multilayered structure on said surface, such that the band structure of the multilayer structure is tuned to the desired structure;
  wherein said nanoparticles are optionally associated to the surface or to each other via linking molecules.

The element of the invention may be formed by chemical self-assembly or directed self-assembly to form a variety of layers of different types or multilayer structures. The self-assembly may be used in the processing of a substrate comprising a surface of any type of material, as defined herein. In some embodiments, the self-assembled multilayer may be formed on a material previously formed on a substrate or on a material that has been functionalized to have desired properties.

The substrate and the nanoparticles used in the invention may be pre-made (commercially available) or synthesized prior to association. The substrate and/or at least one type of nanoparticles having known band gap structures may be predetermined i.e., before associating the nanoparticles to the substrate. The substrate and/or at least one type of nanoparticles having known band gap structures may be formed alternately with the association step, e.g., first layer of nanoparticles are associated with the substrate; subsequently, a dopant implantation step is performed, followed by association of a further layer(s).

The association step may be performed by any protocol and means known in the art. In some embodiments, the means for nanoparticles association is by depositing nanoparticles and/or linkers on the substrate. In some embodiments, the deposition means is selected from dipping, spin coating, roll coating, spraying, dispensing, printing, ink-jet printing, lithography, stamping and any combination thereof. In some embodiments, the association step comprises also pre- and/or post treatment steps, e.g., cleaning substrate step.

In some embodiments, the elements of the invention are based on semiconductor substrates, e.g., silicon substrates, silicon-on-insulator substrates, silicon carbide substrates, strained silicon substrates, silicon germanium substrates, gallium arsenide substrates and others, for use in the manufacture of components for use in the electronics industry. The self-assembly constructions may be utilized for processing substrates for use in the production of flat panel displays such as glass, silicon, and plastic.

Depending on the final application, the construction of the element by, e.g., self-assembly may be achieved on a substrate of any size. The size may be in the scale of one nanoparticle (in small nanodevices). In some embodiments, the size of the substrate ranges from small semiconductor substrates having areas of less than one square inch up to 10 inch to larger semiconductor substrates used in the production of electronic components. In some embodiments, the size of the substrate (at least one face of the substrate) is as the size of the device (e.g., chip), which may ranges from 1 to 22 mm. In other embodiments, the size of the substrate may ranges from 10 to 55 micrometer. In other embodiments, the size of the substrate may be 7×7 mm.

The invention also provides a device implementing an element of the invention.

In the above embodiments, the substrate on which the film is provided may be an integral part of a device or may be a substrate which following its treatment as recited is implemented in a device. The device may be an electronic device or an optoelectronic device.

In various designs, an additional layer over the element may be formed. For some applications, the additional layer is a protective layer over the top-most layer or a layer serving as a contact component or a reflecting coating or anti-reflecting coating or any combination thereof.

The element of the invention may be integrated in devices that require transmittance and/or efficient conversion of light including visible, UV, IR, and/or NIR regions of the electromagnetic spectrum. Such devices may be electrical-to-optical and/or optical-to-electrical transducers. Alternatively, such devices are, for example, photoconductors and/or photodiodes and/or solar cells and/or luminescent concentrator, light emitting diodes (LEDs) and/or including organic light emitting diodes and lasers; and/or light sensors and/or pixel sensors, and/or specialized transistors and/or including organic transistors and/or inorganic transistors and/or or hybrid transistors. Other applications for utilization of such coatings are related to the following categories: printed electronics touch screens and/or display backplanes and/or large or small area flexible applications.

In some embodiments, the element of the invention is at least a substrate surface of a photovoltaic cell (a solar cell).

The element of the invention may be integrated into electronic device, specifically, photovoltaic cells by forming the multilayer as described herein on a substrate selected from silicon (monocrystalline or polycrystalline) based solar cells, thin films which may consist semiconductor material that is deposited by means such as CVD (chemical vapor deposition), PVD (pressure vapor deposition), organic semiconductor substrate.

In some embodiments, the multilayer is a luminescence solar (light) concentrator and the substrate may be silicon (or any other). In some embodiments, the light concentrator is an element in a photovoltaic cell device.

In some embodiments, the element of the invention or multiple elements of the invention may be integrated as a multi cells (array) on a substrate obtaining solar panel.

BRIEF DESCRIPTION OF THE DRAWINGS

In order to understand the disclosure and to see how it may be carried out in practice, embodiments will now be described, by way of non-limiting example only, with reference to the accompanying drawings, in which.

DETAILED DESCRIPTION OF EMBODIMENTS

Antenna complexes of photosynthetic cyanobacteria (oxygen evolving prokaryotes) poses superior excitation transfer efficiency at room temperature. Recent studies showed that the exceptional energy transfer in certain antenna systems could be ascribed to coherent quantum properties. Photosynthetic antenna proteins have been studied that are isolated and dried on several substrates. Preliminary results show ordering of the proteins followed by a peak shift from the in vitro protein emission. It has been demonstrated by the inventors that during the drying process the proteins tend to arrange in super-molecular organization mimicking the native proteins. Such structures can serve as a nano-metric energy transmission lines, and may be used to couple light to nano devices.

In order to build artificial molecules, quantum dots or any other nanoparticle grown by colloidal chemistry (referred to herein in general as "nanocrystals", NCs) have been used to demonstrate a controlled growth of composition and size. These systems have been employed in conjunction with semiconducting polymers to create both light-emitting diodes and photovoltaic devices, utilizing the highly tunable level structure of NCs as well as the chemical process ability of the particles.

Attaching NCs to a solar cell device via organic molecules, using self-assembly methods, makes the production of the system simple and flexible in terms of the materials (semiconductors, metals, ferroelectric) and accessible range of NC dimensions. In the approach implemented in the technology of the invention, the inventors introduce a novel nano toolbox enabling control over coupling and charge transfer between the NC and the substrate.

Figure 1:
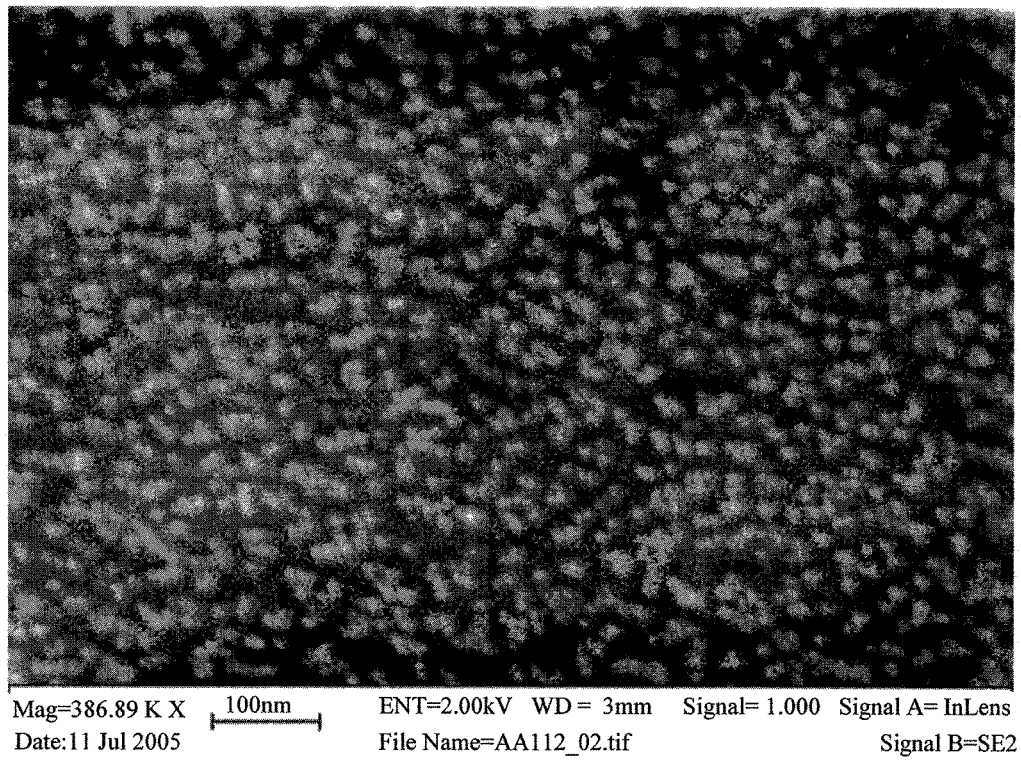
FIG. 1 is a SEM micrograph of the InAs nanodot monolayer.

Combining NCs, organic linkers, and a semiconductor solar cell, this tool box can be used to tune the response spectrum by changing the size or nature of the NCs and by controlling coupling. FIG. 1 presents a SEM scan of an InAs nano crystal monolayer attached to the GaAs substrate by organic molecules. The molecules can be selected according to their length and chemical bond strength, which influence the electron or hole conductance, as well as its molecular symmetry affecting the spin conductance.

This combination of semiconductor NCs having various size-tunable properties, together with control over the binding molecules and the possibility of adding gold NCs creates an arsenal of nanotools that allow self-assembly of all its components into a supramolecular system of pre-designed optical as well as electronic properties.

The multilayered systems are constructed by combining, e.g., semiconductor NCs with organic molecules as linkers. An excited electronic state of a NC donor unit will be prepared by photoexcitation. The charge transfer from photoexcited NC to either a second NC or to the semiconductor substrate was studied for different types of organic linker molecules and different types of nanoparticles.

Measurements conducted have been able to determine the parameters that influence the exact charge, spin or exciton passing the constructed organic barrier. Understanding these coupling effects between the quantum world and the classical device is a key in the bottom-up/up-down approach to quantum device design. The optical measurements results, which demonstrate the changes in coupling using different organic molecules, are presented in FIG. 2.

Figure 2:
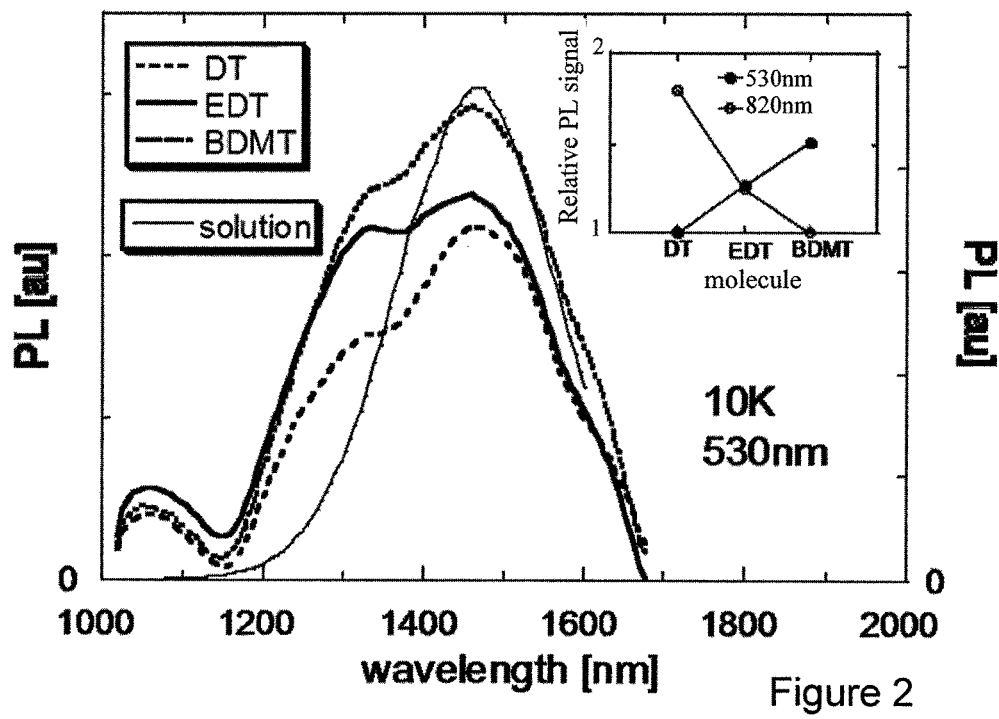
FIG. 2 is a photoluminescence (PL) spectrum of InAs nanodots for different linker molecules measured at 10 K with 100 mW, 532 nm laser. The thin line is the PL spectra of the original solution of NP. The inset shows the integrated signal for two excitation wavelengths of 530 and 830 nm for different attaching molecules. The integrated signal was normalized for the smallest response at each wavelength.

FIG. 2 presents an example of the means to study charge transfer and coupling control using organic molecules by using photoluminescence (PL) measurements. Nanoparticles were connected to a GaAs substrate using three types of molecules: HS—$(CH_2)_2$—SH (EDT ethanedithiol), HS—$(CH_2)_{10}$—SH (decanedithiol DT), and HS—$CH_2$-φ-$CH_2$—SH (benzenedimethanethiol BDMT). The PL spectra of the InAs nanodots for different linker molecules were measured at 10 K with 100 mW, 532 nm laser. The thin line in FIG. 2 is the PL spectrum of the original solution with the nano crystals (NCs). At 530 nm, the GaAs substrate absorbed most of the laser power and a considerable portion of the charge reached the substrate surface. Therefore, the stronger the coupling was, the stronger the PL signals which have been observed. At only 830 nm the NCs adsorbed the laser power and an opposite effect was observed. The inset shows the integrated signal for two excitation wavelengths of 530 and 830 nm for different attaching molecules. The integrated signal was normalized to the smallest response at each wavelength.

Figure 3:
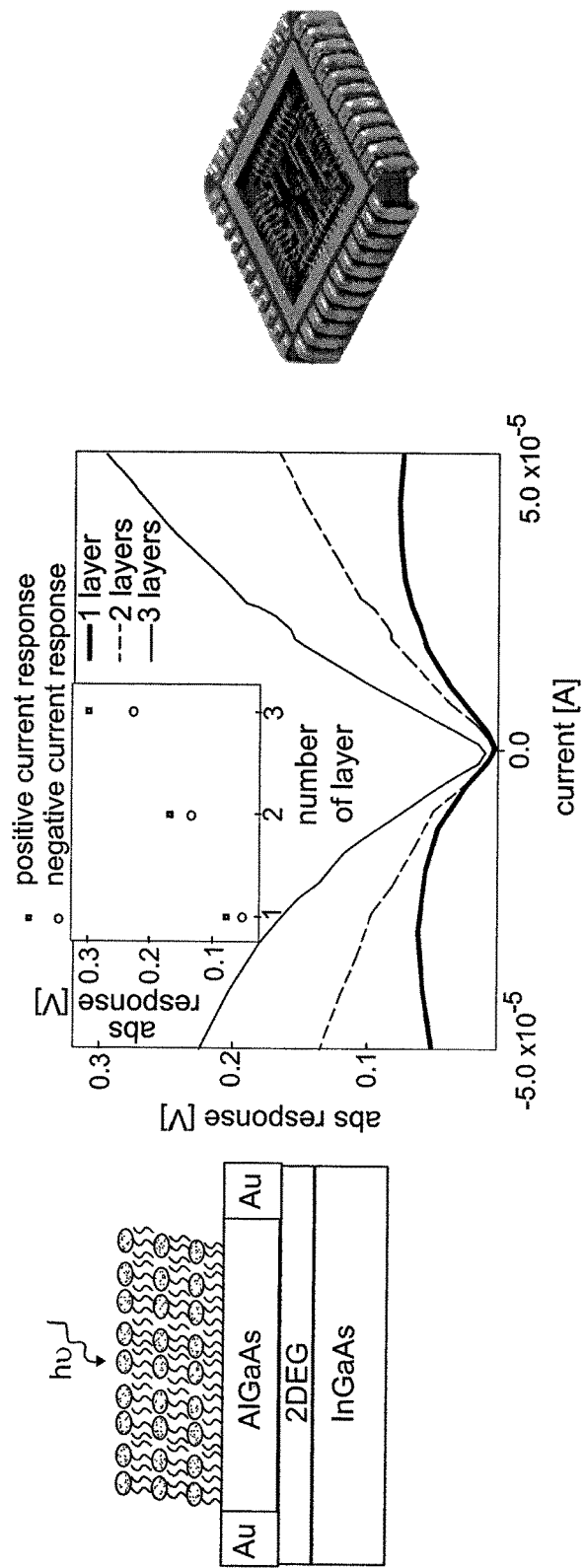
FIG. 3 presents, on the left, a schematic illustration of a transistor device; on the middle, absolute response of the device as a function of the source-drain current at 300 K; and on the right, the actual device. Inset: shows the nonlinear absolute response as a function of number of layers.

The charge and energy transfer efficiency using three layers of NCs is shown in FIG. 3 left. The sensors were prepared by standard photo lithography techniques and coupled to a FET device. FIG. 3 center shows the absolute response of the device as a function of the source-drain current at 300 K. The inset shows the nonlinear absolute response as a function of number of layers. It is clear that the response increases with the number of layers. By changing the coupling efficiency of each layer we achieved a non-linear response as a function of the number of layers. Together with the optical measurements both the charge and energy transfer could be measured. Charge transfer activates the device response and energy transfer can be measured optically. Exploiting both tools together was essential to probe the properties of the suggested complex structure.

Solar Cells
Properties of Si Solar Cells

The inventors have used a Si PN solar cell and compared the response of the solar cell with and without the nano crystals (NCs) layers. For this propose new n type Si wafers were obtained. All wafers were implanted in core systems creating a p-doped region above the n-type layer. After the implantation the solar cells were realized using standard photolithographic techniques.

Figure 4:
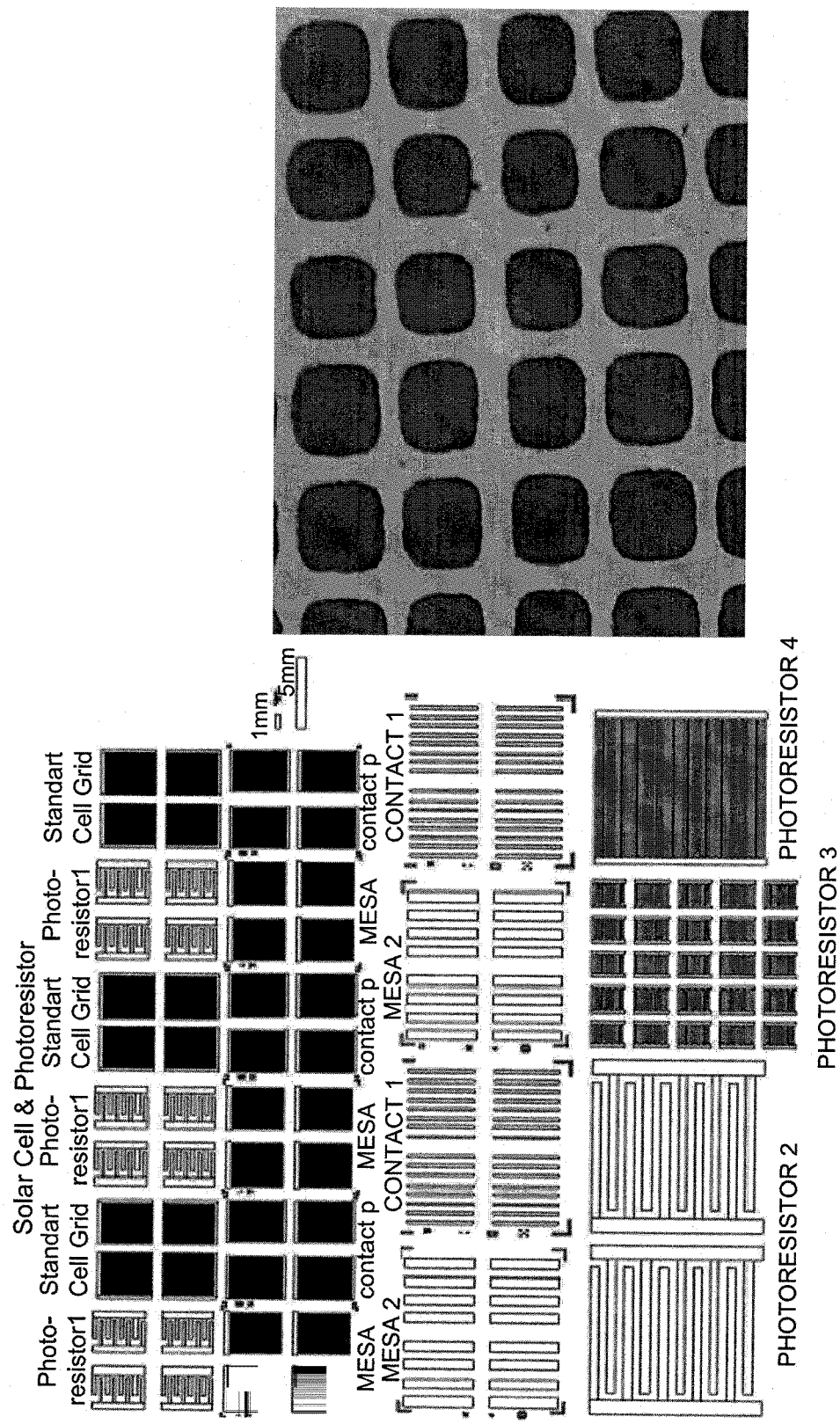
FIG. 4 presents, on the left a scheme of the designed mask of the Si photo cell; on the right a picture of the PN photo cell used for measurements.

FIG. 4 left presents the mask used to fabricate the solar cells. An optical image of the solar cell is presented in the right picture of FIG. 4.

Figure 5:
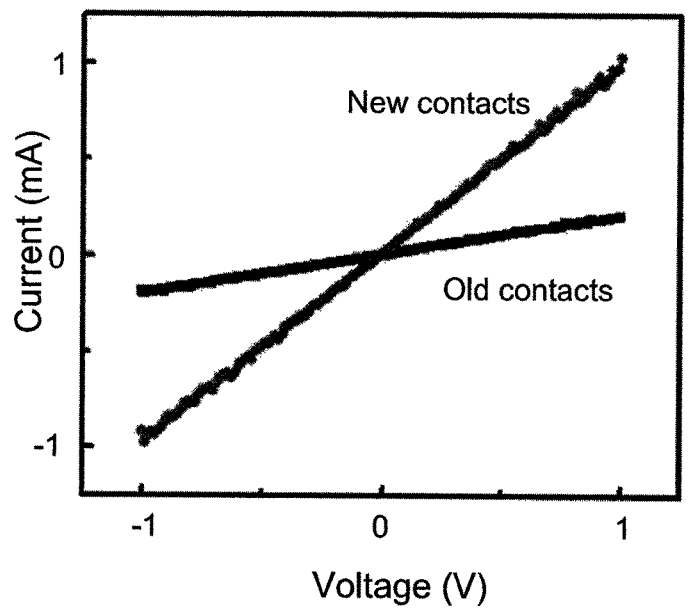
FIG. 5 is an I-V curve of a solar cell with old and new contacts. The new contacts IV shown are ohmic for the −1 to 1V range, with resistance of 1 kOhm.

For a full solar cell, optimization of the load was necessary in order to achieve maximum efficiency. In this case contacts with lower resistance were realized. Ohmic contacts with 1K ohm resistance (FIG. 5) were achieved.

Figure 6:
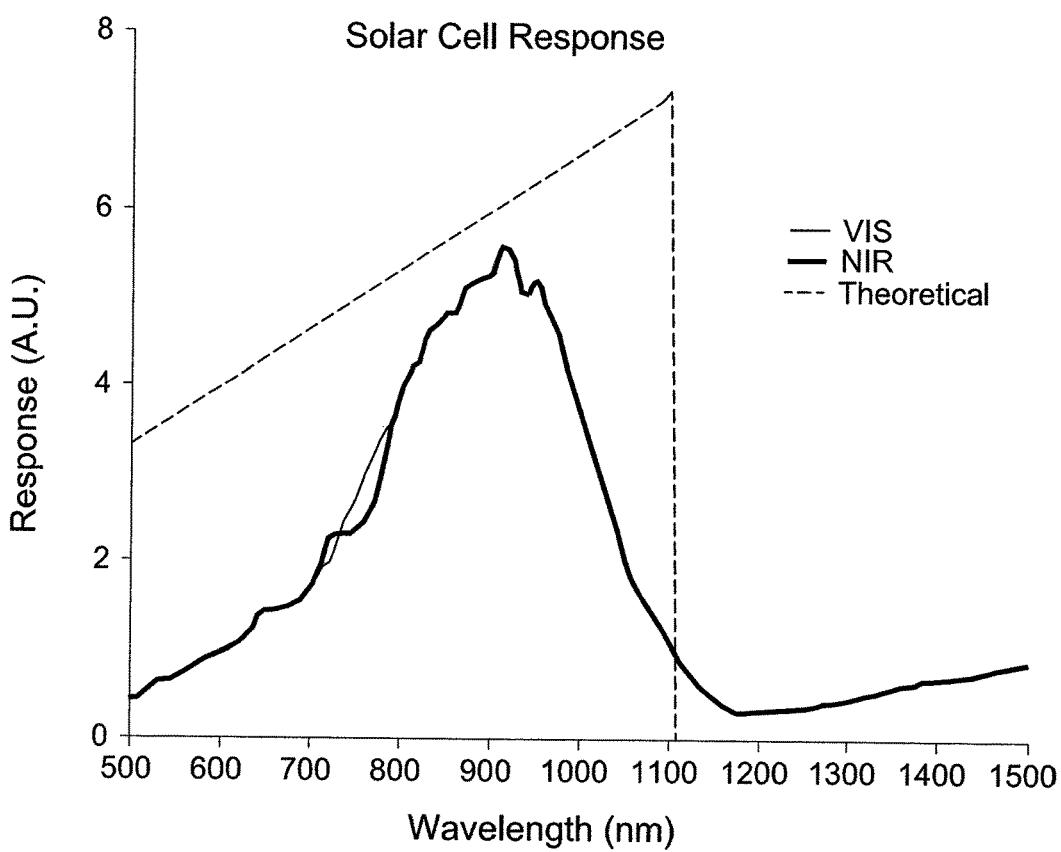
FIG. 6 is the spectral response curve of a measured cell.

FIG. 6 shows the spectral response of a fabricated solar cell. At the UV region the response of the cell was less than 1% of the total response. Comparing the total response of a detector before and after the NCs adsorption, it was possible to measure a greater improvement in the response. This improvement was assumed to originate mainly from the short wavelength increase in efficiency.

Figure 7:
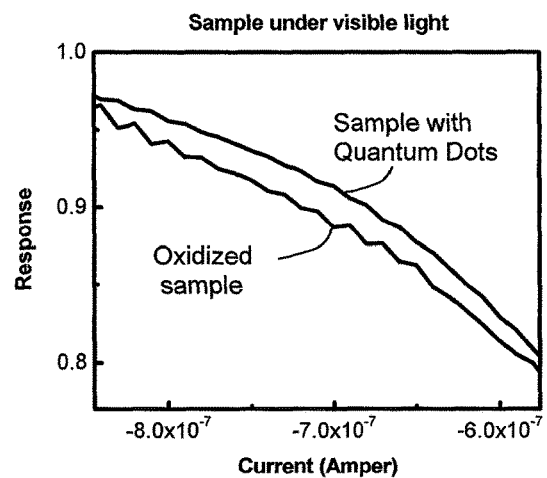
FIG. 7 is a graph of the response to visible light of the same solar cell with NCs, before and after oxidizing the NCs.

In FIG. 7 a comparison between the response of the same cell before and after oxidation of the NCs is demonstrated. To compare the effect of oxidation on the exact same cell, the solar cell with the NCs was deliberately exposed to NCs oxidation process a glove box. It was possible to observe that the layers adsorbed on a solar cell according to the present invention were immune to short time oxidation. Using CdS NCs the response of the device was not changed over a week of measurements.

Figure 8:
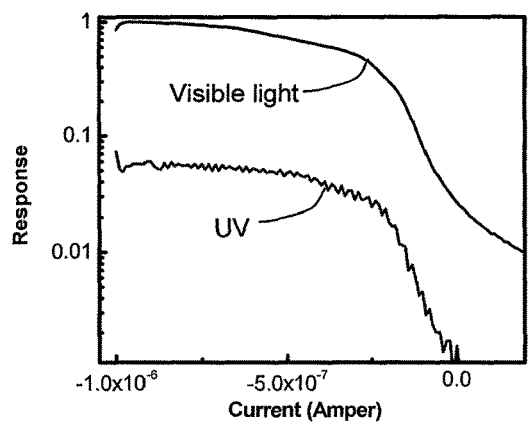
FIG. 8 is a normalized response graph of the Si detector to the visible and UV light.

Using the NCs layer to convert the UV light to the visible, an improvement was achieved in the solar cell performance. The total response of the UV light absorption of the solar cell with NCs layers was around 5% of the visible response (FIG. 8). Without the NCs the response of the UV was around less than half.

Improvement of the Si Cell by 5 Monolayer Adsorption

Figure 9:
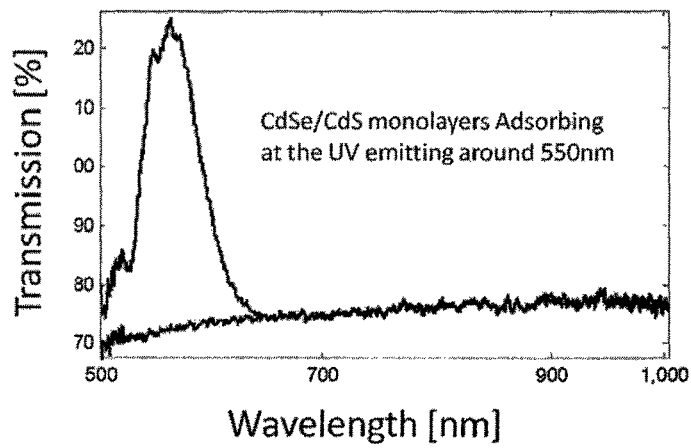
FIG. 9 is a transmission graph of a solar cell with and without 5 monolayers of NCs.

Comparing the total response of the detector before and after adsorption of 5 monolayers, it was possible to measure about a greater improvement. This improvement was attributed to the short wavelength increase in efficiency. Comparing the transmission in the UV through a transparent film with and without the layers, enhanced emission was observed for the layered structure around 550 nm, as shown in FIG. 9.

Improvement of Si Solar Cell by Using Doped NCs in the UV and IR Regions

In order to increase the cells efficiency using the infrared spectrum, Ag doped ZnO nano crystals that show IR adsorption were used. Using the 5 ZnO NCs layers that converted UV light to the visible, the total response of the UV light absorption of the solar cell with NCs layers was around 8% of the visible response. Without the NCs, the response of the UV was less then one forth of the absorption.

The invention claimed is:

1. An element comprising
a substrate comprising a substrate material and having a substrate surface having one or more substrate surface regions; and
a multilayered structure comprising at least two nanoparticle layers, said multilayered structure being associated with at least one of the one or more substrate surface regions, each of said at least two nanoparticle layers comprising nanoparticles of a different type,
a band gap of the substrate material being larger than a band gap of nanoparticles in a layer directly associated with the substrate, and the band gap of the substrate material being smaller than a band gap of nanoparticles in a top-most layer of said multilayered structure, and
wherein each of said at least two nanoparticle layers is associated via one or more organic linker molecules to the substrate surface and/or nanoparticles of a neighboring layer, to cause charge or energy transfer between the at least two nanoparticle layers.

2. The element according to claim 1, wherein the multilayered structure comprises (a) a first nanoparticles layer, (b) the top-most layer, and (c) at least one additional layer of nanoparticles, being positioned between the first nanoparticles layer and the top-most layer, wherein the band gap of the nanoparticles of said at least one additional layer (c) being smaller than the band gap of the nanoparticles in the top-most layer (b) and larger than the band gap of the nanoparticle in the first layer (a).

3. The element according to claim 1, wherein the nanoparticles in any of the at least two nanoparticle layers of the multilayered structure are associated to each other or to the substrate via the one or more organic linker molecules.

4. The element according to claim 3, wherein the one or more organic linker molecules is selected to permit charge or energy transfer (up-conversion or down-conversion) between each two layers or a layer and the substrate.

5. The element according to claim 3, wherein the one or more organic linker molecules is bifunctional.

6. The element according to claim 1, wherein the nanoparticles in any of the at least two nanoparticle layers of the multilayered structure are composed of a material selected from a semiconductor and/or a metal.

7. The element according to claim 1, wherein the nanoparticles in any of the at least two nanoparticle layers of the multilayered structure comprise metallic material.

8. The element according to claim 1, wherein the nanoparticles in any of the at least two nanoparticle layers of the multilayered structure are doped with at least one atom or at least one ion.

9. The element according to claim 1, wherein the different type of the nanoparticles of the each of said at least two nanoparticle layers is selected from at least one of nanoparticle material, particle size, particle shape, particle structure, presence or absence of doping atoms (materials), selection of dopants, concentration of dopants, valance band offset, and particle band structure.

10. A device implementing the element according to claim 1.

11. The device according to claim 10, configured for converting light to electrical energy or vice versa.

12. The device according to claim 11, being a photovoltaic cell.

13. The element according to claim 1, wherein each of the at least two nanoparticle layers is associated directly or via the one or more organic linker molecules with the substrate surface and/or nanoparticles of a preceding and/or subsequent layer.

14. The element according to claim 1, wherein the charge or energy transfer between each two nanoparticle layers or a nanoparticle layer and the substrate enables light harvesting.

15. A light harvesting device being an element according to claim 1.

* * * * *